United States Patent
Kolics

(10) Patent No.: US 8,328,919 B2
(45) Date of Patent: Dec. 11, 2012

(54) ELECTROLESS DEPOSITION SOLUTIONS AND PROCESS CONTROL

(75) Inventor: Artur Kolics, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 90 days.

(21) Appl. No.: 12/731,115

(22) Filed: Mar. 24, 2010

(65) Prior Publication Data

US 2011/0014361 A1 Jan. 20, 2011

Related U.S. Application Data

(63) Continuation of application No. PCT/US2009/050833, filed on Jul. 16, 2009.

(51) Int. Cl.
*C23C 18/34* (2006.01)
*C23C 18/36* (2006.01)
*C23C 18/40* (2006.01)
*C23C 18/44* (2006.01)

(52) U.S. Cl. ........................ 106/1.22; 106/1.25; 106/1.27

(58) Field of Classification Search .................. 106/1.22, 106/1.25, 1.27
See application file for complete search history.

(56) References Cited

U.S. PATENT DOCUMENTS

| | | | | |
|---|---|---|---|---|
| 2,872,354 A * | 2/1959 | Lee | | 106/1.27 |
| 4,152,164 A * | 5/1979 | Gulla et al. | | 106/1.27 |
| 4,350,717 A * | 9/1982 | Araki et al. | | 427/8 |
| 4,353,933 A * | 10/1982 | Araki et al. | | 427/8 |
| 4,406,250 A * | 9/1983 | Araki et al. | | 118/690 |
| 4,565,585 A | 1/1986 | Matsuda | | |
| 5,182,131 A * | 1/1993 | Hashimoto et al. | | 427/8 |
| 5,368,715 A | 11/1994 | Hurley et al. | | |
| 5,993,892 A * | 11/1999 | Wasserman et al. | | 427/8 |
| 6,524,642 B1 | 2/2003 | Leibman et al. | | |
| 6,638,564 B2 | 10/2003 | Segawa et al. | | |
| 6,645,567 B2 * | 11/2003 | Chebiam et al. | | 427/443.1 |
| 6,821,324 B2 * | 11/2004 | Shacham-Diamand et al. | | 106/1.22 |
| 6,902,605 B2 * | 6/2005 | Kolics et al. | | 106/1.22 |
| 6,911,067 B2 * | 6/2005 | Kolics et al. | | 106/1.22 |
| 7,658,790 B1 * | 2/2010 | Gorer et al. | | 106/1.22 |
| 2004/0144285 A1 * | 7/2004 | Stark et al. | | 106/1.27 |
| 2007/0092658 A1 | 4/2007 | Owatari et al. | | |
| 2009/0155468 A1 | 6/2009 | Petrov et al. | | |

* cited by examiner

*Primary Examiner* — Helene Klemanski
(74) *Attorney, Agent, or Firm* — Martine Penilla Group, LLP

(57) ABSTRACT

One embodiment of the present invention is a method of electroless deposition of cap layers for fabricating an integrated circuit. The method includes controlling the composition of an electroless deposition bath so as to substantially maintain the electroless deposition properties of the bath. Other embodiments of the present invention include electroless deposition solutions. Still another embodiment of the present invention is a composition used to recondition an electroless deposition bath.

16 Claims, No Drawings

ELECTROLESS DEPOSITION SOLUTIONS AND PROCESS CONTROL

This application claims priority under 35 U.S.C. §§120 and 365(c) as a continuation application of prior International Application PCT/US09/50833, which was filed on Jul. 16, 2009, and which was published in English under PCT Article 21(2). The disclosure of the prior international application is incorporated herein by reference.

BACKGROUND

This invention pertains to fabrication of electronic devices such as integrated circuits; more specifically, this invention relates to methods of electroless plating solution management and electroless plating solutions.

Process control is a critical aspect of fabricating complex devices such as electronic devices. For devices such as integrated circuits, the process specifications and the process results must meet strict specifications in order to assure the desired performance for the integrated circuits. Not only is there the challenge of achieving desired process specifications and process results, there is the added challenge of maintaining those specifications and results for processing numerous substrates under, preferably, economical conditions.

In order to meet the requirements for electronic devices, processes such as electroless deposition have been adopted for applications such as depositing cap layers for copper-dielectric metallization structures. Electroless deposition processes offer selective deposition of cap layers such as cobalt-based cap layers and such as nickel-based cap layers. Some more preferred cap layers are multi-element alloys such as cobalt alloy, cobalt-tungsten alloy, cobalt-tungsten-phosphorous-boron alloy, cobalt-nickel alloy, and nickel alloy. The complexity of some of the desired compositions for cap layers requires complex reaction chemistries to produce those layers and there is a correspondingly complex problem in process control for process equipment such as electroless deposition equipment and associated electroless deposition bath.

Successful process control for electroless deposition equipment involves maintaining the electroless deposition bath within required specifications so as to achieve the desired process results. Typically, there is an acceptable range of specifications for operating the electroless deposition bath. Important parameters to be maintained during electroless deposition practice are deposition rate, bath stability, film composition, film coverage, and film roughness. These parameters are usually maintained by controlling the composition of the electroless deposition bath, particularly the amounts of reactants such as metal ion sources, reducing agents, and pH adjustors. When the loading in the deposition solution is high compared to the concentration of consumed bath components, the concentration of byproducts can quickly build up in the plating bath when the plating solution is used in a recirculation mode or a batch mode. This change in the electroless bath composition can alter the deposition process and, consequently, the deposition rate and some of the characteristic properties of the film.

There are known approaches to monitoring and maintaining the operation of electroless deposition baths. In most cases, the reducing agent concentration, the metal ion concentration, and the pH of the plating bath are monitored in addition to the temperature of the bath. In order to maintain the bath in a predetermined process window, chemicals have to be added to the bath if the reducing agent concentration, the metal ion concentration, and/or the pH are out of specification. One can maintain the bath by adding as needed pH adjustor, reducing agent, and metal ions. In addition to the concentration adjustment, fresh solution may be added to the plating solution from time to time since a part of the solution may be lost due to drag-out when the plated substrate is removed from the plating chamber.

Although methods of electroless deposition solution management and electroless deposition solutions are known, the present inventor has recognized a need for new and/or improved methods of managing electroless deposition solutions and new and/or improved electroless deposition solutions for electroless deposition of cap layers used to fabricate electronic devices.

SUMMARY

This invention pertains to processing substrates such as substrates used for fabrication of electronic devices. One aspect of the present invention is a method of processing the substrate. One embodiment of the present invention is a method of depositing cap layers by electroless deposition and methods of maintaining an electroless deposition bath. Another aspect of the present invention includes solutions and compositions used for processing substrates. An embodiment of the present invention includes an electroless deposition solution for cap layers. Another embodiment of the present invention is a composition configured to replenish an electroless deposition bath for depositing cap layers.

It is to be understood that the invention is not limited in its application to the details of construction and to the arrangements of the components set forth in the following description. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

DESCRIPTION

This invention pertains to processing substrates such as substrates used for fabrication of electronic devices. The operation of embodiments of the present invention will be discussed below, primarily in the context of processing semiconductor wafers such as silicon wafers used for fabricating integrated circuits. Metallization layers for the integrated circuits include copper for metal lines formed into damascene or dual damascene dielectric structures. Optionally, the dielectric is a low k dielectric material such as a carbon doped silicon oxide (SiOC:H). The following disclosure is directed towards preferred processes and solutions for electroless deposition of cap layers comprising at least cobalt onto the copper. However, it is to be understood that embodiments in accordance with the present invention may be used for other semiconductor devices, metals other than copper, cap layers other than cobalt, and wafers other than semiconductor wafers.

The following definitions will be used for discussion of preferred embodiments of the present invention. Byproducts are components formed in the electroless deposition solution as a result of performing the chemical reactions to form the cap layer on a substrate. Reactants are components of the electroless deposition solution which are consumed during the reaction to form the cap layer. The reactants comprise, for example, the metal ion sources and the reducing agent. Supplements are components in the electroless deposition solution which do not directly produce byproducts. Examples of supplements include, but are not limited to, complexing agents, stabilizers, surfactants and the like. Replenishing composition is a combination of any one or more of the reactants, any one or more of the byproducts, and/or any one or more of the supplements added to the electroless deposition bath to maintain the performance of the electroless deposition bath within specification.

Given below are electroless deposition solutions according to preferred embodiments of the present invention. The electroless deposition solutions include reactants, byproducts, and may include supplements. For one embodiment, the electroless deposition solution includes a metal ion source, one or more reducing agents, one or more byproducts from the reactions between the metal ion source and the reducing agent, and may include one or more pH adjustors, one or more complexing agents, one or more secondary element sources, and if needed, one or more buffering agents.

The metal ion source typically makes up the largest component of the cap layer. For preferred embodiments of the present invention, the metal ion source is a source of cobalt for cobalt or cobalt alloy cap layers. The cobalt source can be practically any soluble cobalt (II) salt. Some examples are cobalt sulfate and cobalt chloride. The use of high purity cobalt (II) hydroxide would be even more advisable. This compound is sparingly soluble in water but easily dissolves in presence of complexing agents or acids. With the application of metal hydroxides instead of the commonly used soluble metal salts such as metal sulfate, chloride, or nitrate salts the contamination level in the electroless deposited layer can be further minimized. As a replacement for cobalt for some embodiments of the present invention, a nickel source may be used to produce nickel-based cap layers.

The reducing agent reduces metal ions in the solution to form the cap layer on the substrate surface. The preferred reducing agent is hypophosphite, which is introduced into the bath in the form of a compound such as hypophosphorous acid, an alkali-metal-free salt of hypophosphorous acid, and a complex of a hypophosphoric acid. The hypophosphite also serves as a source of phosphorous in the deposited layer. Another usable reducing agent is dimethylamine borane (DMAB), which may also be used as a source of boron for the cap layer. Other boranes suitable as a reducing agent in the deposition solution include, but are not limited to, alkyl amine boranes, dialkyl amine boranes, trialkyl amine boranes. Another usable reducing agent for the electroless deposition solution is hydrazine.

The one or more byproducts from the reactions between the metal ion source and the reducing agent will depend on the process chemistry used to accomplish the electroless deposition. According to preferred embodiments of the present invention, the reducing agent comprises a hypophosphite which produces phosphite as a byproduct of the reactions between the metal ion source and the reducing agent. This means that an amount of phosphite is included in the electroless deposition solution for preferred embodiments of the present invention.

Similarly, preferred embodiments of the present invention that use amine boranes for the reducing agent will have amines as a byproduct. This means that an amount of amines is included in the electroless deposition solution for preferred embodiments of the present invention. More specifically, embodiments of the present invention that use dimethylamine borane as a reducing agent would produce dimethylamine as a byproduct of the reaction between the metal ions and the reducing agent. Consequently, embodiments of the present invention that use dimethylamine borane as a reactant also include the reaction byproduct dimethylamine in the electroless deposition solutions for preferred embodiments of the present invention.

Other possible byproducts that may be included in preferred embodiments of the present invention may be salts formed by neutralization of acid generated during electroless deposition.

For preferred embodiments of the present invention, the pH adjustor comprises a quaternary ammonium hydroxide to adjust the pH of the solution. The quaternary ammonium hydroxide used in the electroless deposition solution to adjust the pH of the solution described herein may be selected from a variety of compounds. Examples of pH adjustors include, but are not limited to, tetra-ammonium hydroxide, tetramethylammonium hydroxide, tetraethylammonium hydroxide, tetrapropylammonium hydroxide, tetrabutylammonium hydroxide, methyltriethylammonium hydroxide, ethyltrimethylammonium hydroxide, benzyltrimethylammonium hydroxide, and any other longer alkyl chain ammonium hydroxides that are adequate for maintaining the solution pH.

The one or more complexing agents, preferably, keep the metal ions in the solution even at pH values where the metal ions otherwise would form insoluble metal hydroxide. Common applicable complexing ions include, but are not limited to, citrate, tartrate, glycine, pyrophosphate, and ethylene tetra-acetic acid (EDTA). The complexing agents are introduced into the bath as acids. Specifically, citrate is introduced as citric acid, tartrate is introduced as tartaric acid, or pyrophosphate is introduced as pyrophosphoric acid. Preferred embodiments of the present invention use citric acid as a complexing agent but the use of other complexing agents or their combinations is also possible.

Second metal ion sources may be included to improve the corrosion resistance of the cap layer. For cobalt tungsten alloys, this ion is preferably a tungsten (VI) compound, such as tungsten (VI) oxide ($WO_3$) or tungsten phosphoric acid $H_3[P(W_3O_{10})_4]$, however tungsten in other oxidation states such as V or IV, are also applicable. The aforementioned second metal can be selected from the 4th period of the periodic table, 5th period of the periodic table, and 6th period of the periodic table. Preferred second metals selected from the 4th period of the periodic table are Cr and Ni. Preferred second metals from the 5th period of the periodic table are Mo, Ru, Rh, and Pd. Preferred second metals selected from the 6th period of the periodic table are W, Re, Os, Ir, and Pt. Preferred embodiments of the present invention use a tungstate as the tungsten source.

As indicated above, the buffering agent may not be needed for some embodiments of the present invention. The need for a buffering agent will depend upon the process chemistry being used to form the cap layer. A preferred buffering agent for embodiments of the present invention comprises a borate, which may be incorporated into the solution as boric acid. More specifically, the most common compound used to buffer solutions in the pH range 8 to 10 is boric acid. As an option, buffering agents other than borates/boric acid may also be used for embodiments of the present invention.

If necessary, other non-essential components can also be added to the bath for purposes such as to change properties of the deposited film, rate of deposition, solution stability, and improve resistance to corrosion. These auxiliary components and their functions are the known to persons of ordinary skill in the art; see for example U.S. Pat. No. 6,911,067 to Kolics et al. for details. U.S. Pat. No. 6,911,067 to Kolics et al. is incorporated herein, in its entirety, by this reference.

One embodiment of the present invention is a solution for electroless deposition of a cap layer. More specifically, the solution is configured so as to support electroless deposition reactions for forming the cap layer. The solution comprises an amount of an amine identified as a by-product of the electroless deposition reaction and/or an amount of a phosphite identified as a byproduct of the electroless deposition reaction. For a preferred embodiment of the present invention, the amine comprises dimethylamine. An embodiment of the present invention for a particular application uses dimethylamine at a concentration of about 0.01 gram moles per liter. For a preferred embodiment of the present invention the phosphite concentration is about 0.01 gram moles per liter. In a still further embodiment, the amine comprises a dimethylamine at a concentration of about 0.01 gram moles per liter and the phosphite concentration is about 0.01 gram moles per liter. In a preferred embodiment of the present invention, the cap layer comprises cobalt so as to form cobalt cap layers. As an option for other embodiments of the present invention the cap layer may comprise a metal such as nickel.

According to a more preferred embodiment of the present invention, the electroless deposition solution is configured for deposition of a cap layer that comprises cobalt, tungsten, phosphorous, and boron. The electroless deposition solution comprises an amount of cobalt, an amount of borane, an amount of hypophosphite, an amount of tungstate, an amount of citrate, an amount of borate, an amount of an amine, and an amount of a phosphite. For each of the components of the electroless deposition solution, the amount corresponds to an effective amount to accomplish the deposition. According to one embodiment, the electroless deposition solution comprises a cobalt concentration of about 0.012 gram moles per liter, a borane concentration of about 0.015 gram moles per liter, a hypophosphite concentration of about 0.083 g moles per liter, a tungstate concentration of about 0.023 gram moles per liter, a citrate concentration of about 0.123 gram moles per liter, a borate concentration of about 0.077 gram moles per liter, a dimethylamine at a concentration of about 0.01 gram moles per liter, and a phosphite at a concentration of about 0.01 gram moles per liter.

Another aspect of the present invention includes a composition for replenishing an electroless deposition bath for deposition of a cap layer that includes a metal. As an option, the electroless deposition bath may comprise an electroless deposition solution as presented above for embodiments of the present invention. In one embodiment of the present invention, the composition for replenishing the electroless deposition bath for deposition of the cap layer comprises a concentration of the metal derived from a mathematical model of the electroless deposition bath. As an option, the concentration of the metal is derived from a mass balance for the operation of the electroless deposition bath. In one embodiment of the present invention, the concentration of the metal is from about 3 times to about 10 times higher than the concentration of the metal reactant in the electroless deposition bath. According to another embodiment of the present invention, the concentration of the metal is from about 5 times to about 10 times higher than the concentration of the metal reactant in the electroless deposition bath. For another embodiment of the present invention, the concentration of the metal is about 5.1 times higher than the concentration of the metal reactant in the electroless deposition bath.

A preferred embodiment of the present invention uses cobalt as the metal. A preferred embodiment for a specific application uses cobalt as the metal and the composition comprises a cobalt concentration of about 0.0612 gram moles per liter. Of course, other embodiments of the present invention may use metals other than cobalt. Another preferred embodiment uses nickel to form nickel layers.

According to another preferred embodiment of the present invention, the composition for replenishing the electroless deposition bath further comprises an amount of an amine identified as a byproduct of the electroless deposition reaction and/or an amount of a phosphite identified as a byproduct of the electroless deposition reaction. A preferred amine is dimethylamine which occurs as a byproduct for electroless deposition reactions between metal ions in the solution and reducing agents such as dimethylamine borane. A phosphite is included in the composition because it occurs as a byproduct of the reactions between metal ions in the electroless deposition solution reduced by hypophosphite included in the electroless deposition solution. As an option, the dimethylamine concentration is about 0.038 gram moles per liter and the concentration of the phosphite is about 0.037 gram moles per liter.

A more preferred embodiment of the present invention includes a composition for replenishing an electroless deposition bath for depositing cap layers having cobalt, tungsten, phosphorous, and boron. The composition for replenishing the electroless deposition bath includes an amount of cobalt, an amount of hypophosphite, an amount of tungstate, an amount of citrate, an amount of borate, an amount of dimethylamine, and an amount of phosphite. For each of the components of the composition for replenishing the electroless deposition solution, the amount corresponds to an effective amount to accomplish replenishment of the bath so as to substantially maintain the performance of the electroless deposition bath.

Some of the specific properties of the composition may depend on the conditions under which the bath operates. Conditions that may be important include, but are not limited to, the composition of electroless plating bath, the amount of solution in the bath, the amount of drag-out for each of the substrates, and the amount of drag-in for each of the substrates. For applications such as deposition of cobalt tungsten phosphorous boron cap layers on 300 mm diameter substrates, such as silicon wafers, with drag-in of 20 milliliters per substrate and bath drag-out of 100 milliliters per substrate, and a 10 liter volume of electroless deposition solution, a preferred embodiment of the composition for replenishing the electroless deposition bath comprises: a cobalt concentration of about 0.0612 gram moles per liter for the metal, a hypophosphite concentration of about 0.325 g moles per liter, a tungstate concentration of about 0.09 gram moles per liter, a citrate concentration of about 0.481 gram moles per liter, a borate concentration about 0.287 gram moles per liter, a dimethylamine concentration of about 0.038 gram moles per liter, and a phosphite concentration of about 0.037 gram moles per liter. Similarly for applications with a mass drag out of 60 milliliters per substrate, the composition for a preferred embodiment of the present invention comprises: a cobalt concentration of about 0.061 gram moles per liter for the metal, a hypophosphite concentration of about 0.32 g moles per liter, a tungstate concentration of about 0.077 gram moles per liter, a citrate concentration of about 0.414 gram moles per liter, a borate concentration of about 0.240 gram moles per liter, a dimethylamine concentration of about 0.032 gram moles per liter, and a phosphite concentration of about 0.031 gram moles per liter.

Another aspect of the present invention is a method of processing substrates such as substrates used for fabricating electronic devices. The method relates to electroless deposition, electroless deposition solutions, and maintenance of electroless deposition baths. In one embodiment, the method is a method of electroless deposition of cap layers containing a metal on substrates having copper and dielectric structures. The method comprises (i) providing an electroless deposition bath having reactants for an electroless deposition reaction to deposit the cap layers and having byproducts for the electroless deposition reaction and (ii) using the electroless deposition bath to deposit cap layers on the substrates. The electroless deposition bath may be a starting bath that has not been used before or a bath that has been used and reconditioned to substantially the same properties as a starting bath. The method further comprises (iii) replenishing the electroless deposition bath by adding calculated effective amounts of one or more of the reactants and calculated effective amounts of one or more of the byproducts. Preferably, the replenishing the electroless deposition bath is performed so that cap layers can be deposited on additional substrates with the electroless deposition bath having substantially the same properties as in (i). More specifically, the replenishing the electroless deposition bath is configured to maintain the performance of the electroless deposition bath so as to prolong the use of the electroless deposition bath.

According to preferred embodiments of the present invention, the calculated effective amounts of the one or more reactants and the calculated effective amounts of the one or more byproducts are derived from a mathematical model of the electroless deposition bath. As an option, the calculated effective amounts of the one or more reactants and the calculated effective amounts of the one or more byproducts are derived from a mass balance for the operation of the electroless deposition bath. For one embodiment of the present invention, the calculated effective amounts of the one or more reactants includes a concentration of the metal reactant that is from about 3 times to about 10 times higher than the concentration of the metal reactant in the electroless deposition bath. In another embodiment of the present invention, the calculated effective amounts of the one or more reactants includes a concentration of the metal reactant that is from about 5 times to about 10 times higher than the concentration of the metal reactant in the electroless deposition bath. According to a preferred embodiment of the present invention, the calculated effective amounts of the one or more reactants includes a concentration of the metal reactant that is about 5.1 times higher than the concentration of the metal reactant in the electroless deposition bath.

For some embodiments of the present invention, it is preferred that replenishing the electroless deposition bath is accomplished by adding the reactants and the byproducts to the deposition bath from at least two reservoirs having dissimilar compositions. For embodiments of the present invention that use cobalt as the metal, the replenishing the electroless plating bath comprises adding the cobalt to the bath from a first reservoir and adding the other reactants and the byproducts from a second reservoir. Cap layers that comprise cobalt, tungsten, phosphorus, and boron deposited using an electroless deposition bath can be reconditioned using embodiments of the present invention by adding the cobalt to the bath from a first reservoir, and adding the tungsten, the phosphorus, the boron, and the byproducts from a second reservoir. Embodiments of the present invention that use two reservoirs to provide the composition to recondition the electroless deposition bath provide more options for adjusting the ratio of the amount of metal such as cobalt to the other reactants and the byproducts.

According to another embodiment of the present invention, the method includes using a replenishing composition comprising a cobalt concentration about 5.1 times higher than the cobalt concentration in the electroless deposition bath for the metal, an amount of an amine byproduct of the electroless deposition reaction, and an amount of a phosphite byproduct of the electroless deposition reaction. Preferred embodiments of the present invention use an amine byproduct such as dimethylamine. As an option for some embodiments of the present invention, the method includes using a replenishing composition comprising a cobalt concentration about 5.1 times higher than the cobalt concentration in the electroless deposition bath for the metal, a dimethylamine concentration of 0.038 gram moles per liter, and a phosphite concentration of 0.037 gram moles per liter.

The method according to another embodiment of the present invention includes using a replenishing composition comprising a cobalt concentration about 5.1 times higher than the cobalt concentration in the electroless deposition bath for the metal, an amount of hypophosphite; an amount of tungstate; an amount of citrate; an amount of borate; an amount of dimethylamine; and an amount of phosphite.

For applications such as deposition of cobalt tungsten phosphorous boron cap layers on 300 mm diameter substrates, such as silicon wafers, with drag-in of 20 milliliters per substrate and bath drag-out of 100 milliliters per substrate, and a 10 liter volume of electroless deposition solution, a preferred embodiment of the method includes using a replenishing composition comprising a cobalt concentration of about 0.0612 gram moles per liter for the metal, a hypophosphite concentration of about 0.325 gram moles per liter, a tungstate concentration of about 0.09 gram moles per liter, a citrate concentration of about 0.481 gram moles per liter, a borate concentration about 0.287 gram moles per liter, a dimethylamine concentration about 0.038 gram moles per liter, and a phosphite concentration of about 0.037 gram moles per liter. Similarly for applications with a bath drag-out of 60 milliliters per substrate, the method includes using a replenishing composition comprising a cobalt concentration of about 0.061 gram moles per liter for the metal, a hypophosphite concentration of about 0.32 g moles per liter, a tungstate concentration of about 0.077 gram moles per liter, a citrate concentration of about 0.414 gram moles per liter, a borate concentration about 0.240 gram moles per liter, a dimethylamine concentration about 0.032 gram moles per liter, and a phosphite concentration of about 0.031 gram moles per liter.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

What is claimed is:

1. A solution for electroless deposition of a cap layer comprising:
   an amount of an amine identified as a byproduct of the electroless deposition reaction, wherein the amine comprises a dimethylamine at a concentration of about 0.01 gram moles per liter; and
   an amount of a phosphite identified as a byproduct of the electroless deposition reaction, wherein the phosphite concentration is about 0.01 gram moles per liter.

2. The solution of claim 1, wherein the cap layer comprises cobalt, or nickel.

3. The solution of claim 1, wherein the cap layer comprises cobalt, tungsten, phosphorous, and boron; the electroless deposition solution further comprising:
   (a1) an amount of cobalt at a concentration of about 0.012 gram moles per liter;
   (a2) an amount of borane at a concentration of about 0.015 gram moles per liter;
   (a3) an amount of hypophosphite at a concentration of about 0.083 gram moles per liter;
   (a4) an amount of tungstate at a concentration of about 0.023 gram moles per liter;
   (a5) an amount of citrate at a concentration of about 0.123 gram moles per liter; and
   (a6) an amount of borate at a concentration of about 0.077 gram moles per liter.

4. The solution of claim 1, wherein the electroless deposition solution further comprises:
   an amount of borane at a concentration of about 0.015 gram moles per liter; and
   an amount of hypophosphite at a concentration of about 0.083 gram moles per liter.

5. The solution of claim 4, wherein the electroless deposition solution further comprises:
   an amount of citrate at a concentration of about 0.123 gram moles per liter.

6. The solution of claim 1, wherein the cap layer comprises cobalt, tungsten, phosphorous, and boron; the electroless deposition solution further comprising:
   an amount of cobalt at a concentration of about 0.012 gram moles per liter;
   an amount of tungstate at a concentration of about 0.023 gram moles per liter;
   an amount of borate at a concentration of about 0.077 gram moles per liter.

7. A composition for replenishing an electroless deposition bath for deposition of a cap layer that includes a metal, the composition comprising:
   a concentration of the metal derived from a mathematical model of the electroless deposition bath;
   an amount of dimethylamine at a concentration of about 0.038 gram moles per liter; and
   an amount of phosphite at a concentration of about 0.037 gram moles per liter.

8. The composition of claim 7, wherein the concentration of the metal is derived from a mass balance for the electroless deposition bath.

9. The composition of claim 7, wherein the concentration of the metal is:
   (A) from about 3 times to about 10 times higher than the concentration of the metal reactant in the electroless deposition bath, or
   (B) from about 5 times to about 10 times higher than the concentration of the metal reactant in the electroless deposition bath.

10. The composition of claim 7, wherein the concentration of the metal is about 5.1 times higher than the concentration of the metal reactant in the electroless deposition bath.

11. The composition of claim 7, wherein the metal comprises cobalt.

12. The composition of claim 7, wherein the concentration of the metal comprises a cobalt concentration of about 0.0612 gram moles per liter, or the metal comprises nickel.

13. The composition of claim 7,
   wherein the amount of dimethylamine is identified as a by-product of the electroless deposition reaction; and
   wherein the amount of phosphite is identified as a by-product of the electroless deposition reaction.

14. The composition of claim 7, further comprising:
   an amount of cobalt for the metal;
   an amount of hypophosphite;
   an amount of tungstate;
   an amount of citrate; and
   an amount of borate.

15. The composition of claim 7 for a cobalt tungsten phosphorous boron cap layer deposition with a bath drag-out of 100 milliliters per substrate, the composition comprising:
   a cobalt concentration of about 0.0612 gram moles per liter for the metal;
   a hypophosphite concentration of about 0.325 gram moles per liter;
   a tungstate concentration of about 0.09 gram moles per liter;
   a citrate concentration of about 0.481 gram moles per liter; and
   a borate concentration of about 0.287 gram moles per liter.

16. A composition for replenishing an electroless deposition bath for deposition of a cap layer that includes a metal, the composition comprising a concentration of the metal derived from a mathematical model of the electroless deposition bath, the composition for a cobalt tungsten phosphorous boron cap layer deposition with a bath drag-out of 60 milliliters per substrate, the composition further comprising:
   a cobalt concentration of about 0.061 gram moles per liter for the metal;
   a hypophosphite concentration of about 0.32 gram moles per liter;
   a tungstate concentration of about 0.077 gram moles per liter;
   a citrate concentration of about 0.414 gram moles per liter;
   a borate concentration of about 0.240 gram moles per liter;
   a dimethylamine concentration of about 0.032 gram moles per liter; and
   a phosphite concentration of about 0.031 gram moles per liter.

* * * * *